United States Patent [19]
He et al.

[11] Patent Number: 6,051,451
[45] Date of Patent: Apr. 18, 2000

[54] HEAVY ION IMPLANT PROCESS TO ELIMINATE POLYSTRINGERS IN HIGH DENSITY TYPE FLASH MEMORY DEVICES

[75] Inventors: Yue-song He; Yowjuang William Liu, both of San Jose, Calif.

[73] Assignee: Advanced Micro Devices, Inc., Sunnyvale, Calif.

[21] Appl. No.: 09/064,041

[22] Filed: Apr. 21, 1998

[51] Int. Cl.[7] .................. H01L 21/335; H01L 21/336
[52] U.S. Cl. ............................ 438/142; 438/257
[58] Field of Search .............. 257/321; 438/142, 438/257, 588

[56] References Cited

U.S. PATENT DOCUMENTS

| | | |
|---|---|---|
| 3,897,274 | 7/1975 | Stehlin et al. . |
| 4,104,090 | 8/1978 | Pogge . |
| 4,105,805 | 8/1978 | Glendinning et al. . |
| 4,814,285 | 3/1989 | Matlock et al. . |
| 4,923,715 | 5/1990 | Matsuda et al. . |
| 5,316,959 | 5/1994 | Kwan et al. . |
| 5,342,801 | 8/1994 | Perry et al. . |
| 5,346,842 | 9/1994 | Bergemont . |
| 5,378,648 | 1/1995 | Lin et al. . |
| 5,427,967 | 6/1995 | Sadjadi et al. . |
| 5,436,175 | 7/1995 | Nakato et al. . |
| 5,461,001 | 10/1995 | Kurtz et al. . |
| 5,468,657 | 11/1995 | Hsu . |
| 5,589,407 | 12/1996 | Meyyappan et al. . |
| 5,661,068 | 8/1997 | Hirao et al. . |
| 5,668,034 | 9/1997 | Sery et al. . |
| 5,679,475 | 10/1997 | Yamagata et al. . |
| 5,682,052 | 10/1997 | Hidges et al. . |
| 5,686,342 | 11/1997 | Lee . |
| 5,705,419 | 1/1998 | Perry et al. ................ 437/48 |
| 5,817,547 | 10/1998 | Eom ........................ 438/142 |
| 5,933,729 | 8/1999 | Chan ....................... 438/257 |
| 5,939,750 | 8/1999 | Early ....................... 257/321 |

OTHER PUBLICATIONS

High Density Plasma CVD and CMP for .25–μm internetal dielectric processing, Pye, J.T., Fry, H.W., Schaffer, W..J., Solid State Technology, pp. 65–71, Dec. 1995.

A Four–Metal Layer, High Performance Interconnect System for Biploar and BiCMOS Circuits, Wilson Syd R, Freeman Jr. John L, Tracy Clarence I, Solid State Technology, pp. 67–71, Nov. 1991.

Interconnect Metallozation for Future Generations, Roberts Bruce, Harrus Alain, Jacson Robert L, Solid State Technology pp. 69–78, Feb. 1995.

*Primary Examiner*—John F. Niebling
*Assistant Examiner*—Walter L. Lindsay, Jr.
*Attorney, Agent, or Firm*—Amin, Eschweiler & Turocy, LLP

[57] ABSTRACT

A method for fabricating a memory device is provided. A first polysilicon (poly I) layer is formed over a substrate. Poly I isolation rows are etched into the poly I layer so as to form electrically isolated poly I lines. An oxide-nitride-oxide (ONO) layer is formed over the poly I lines and field oxide portions exposed via the poly I isolation rows. A second polysilicon (poly II) layer is formed over the ONO layer. Poly II isolation rows are etched into the poly II layer so as to form electrically isolated poly II lines, the poly II isolation rows being perpendicular in direction to the poly I isolation rows, the poly II isolation rows exposing portions of the ONO layer. Heavy ions are implanted into portions of the poly I layer via the exposed portions of the ONO layer, wherein the heavy ions disrupt silicon bonds of the poly I layer portions. The exposed portions of the ONO layer and the poly I layer portions are substantially etched away.

10 Claims, 10 Drawing Sheets

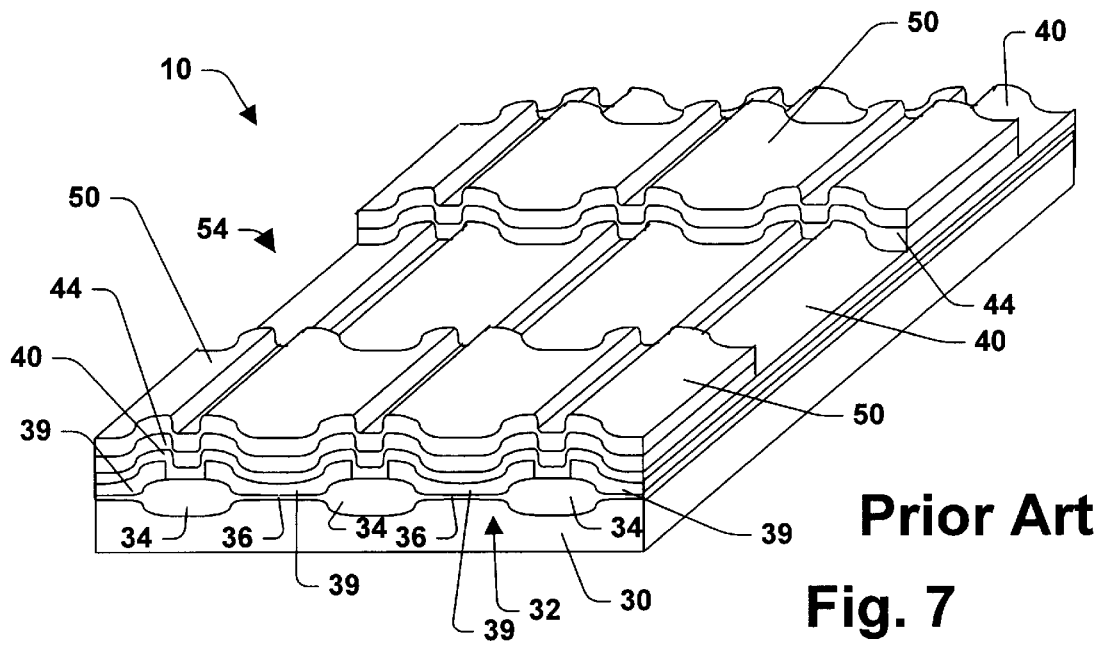
Prior Art
Fig. 7
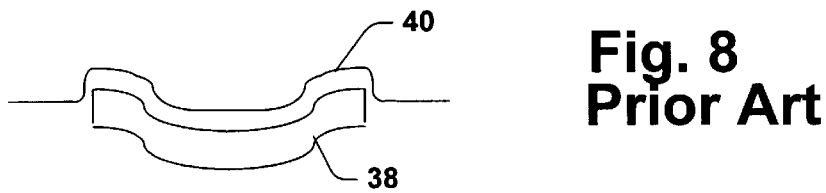
Fig. 8
Prior Art
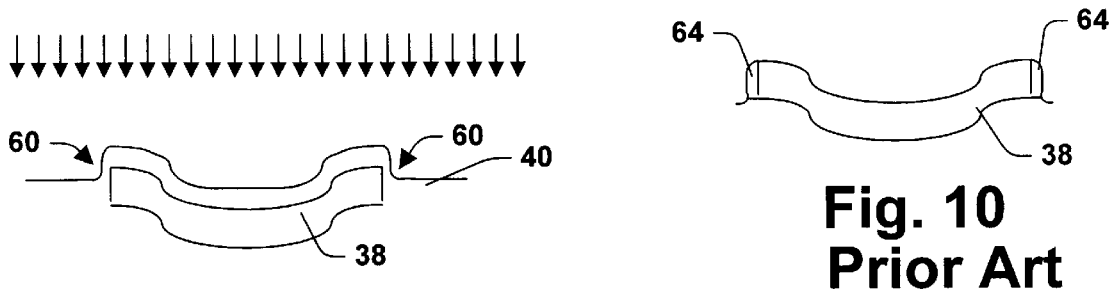
Fig. 9  Prior Art
Fig. 10
Prior Art

HEAVY ION IMPLANT PROCESS TO ELIMINATE POLYSTRINGERS IN HIGH DENSITY TYPE FLASH MEMORY DEVICES

FIELD OF THE INVENTION

The present invention generally relates to integrated circuits and, in particular, to a method of memory device fabrication which improves memory cell reliability and manufacturability by mitigating formation of poly stringers that might be caused by an oxide-nitride-oxide (ONO) fence.

BACKGROUND OF THE INVENTION

Semiconductor devices typically include multiple individual components formed on or within a substrate. Such devices often comprise a high density section and a low density section. For example, as illustrated in prior art FIG. 1, a memory device such as a flash memory 10 comprises one or more high density core regions 12 and a low density peripheral portion 14 on a single substrate 16. The high density core regions 12 typically consist of at least one M×N array of individually addressable, substantially identical memory cells and the low density peripheral portion 14 typically includes input/output (I/O) circuitry and circuitry for selectively addressing the individual cells (such as decoders for connecting the source, gate and drain of selected cells to predetermined voltages or impedances to effect designated operations of the cell such as programming, reading or erasing).

The memory cells within the core portion 12 are coupled together in a circuit configuration, such as that illustrated in prior art FIG. 2. Each memory cell 20 has a drain 22, a source 24 and a stacked gate 26. Each stacked gate 26 is coupled to a word line (WL$_0$, WL$_1$, . . . , WL$_N$) while each drain 22 is coupled to a bit line (BL$_0$, BL$_1$, . . . , BL$_N$). Lastly, each source 24 is coupled to a common source line CS. Using peripheral decoder and control circuitry, each memory cell 20 can be addressed for programming, reading or erasing functions.

Prior art FIG. 3 represents a fragmentary cross-sectional diagram of a typical memory cell 20 in the core region 12 of prior art FIGS. 1 and 2. Such a memory cell 20 typically includes the source 24, the drain 22 and a channel 28 in a substrate 30; and the stacked gate structure 26 overlying the channel 28. The stacked gate 26 includes a thin gate dielectric layer 32 (commonly referred to as the tunnel oxide) formed on the surface of the substrate 30. The tunnel oxide layer 32 coats a portion of the top surface of the silicon substrate 30 and serves to support an array of different layers directly over the channel 28. The stacked gate 26 includes a lower most or first film layer 38, such as doped polycrystalline silicon (polysilicon or poly I) layer which serves as a floating gate 38 that overlies the tunnel oxide 32. On top of the poly I layer 38 is an interpoly dielectric layer 40. The interpoly dielectric layer 40 is often a multilayer insulator such as an oxide-nitride-oxide (ONO) layer having two oxide layers sandwiching a nitride layer, or in the an alternative can be another dielectric layer such as tantalum pentoxide. Finally, the stacked gate 26 includes an upper or second polysilicon layer (poly II) 44 which serves as a polysilicon control gate overlying the ONO layer 40. The control gates 44 of the respective cells 20 that are formed in a given row share a common word line (WL) associated with the row of cells (see, e.g., prior art FIG. 2). In addition, as highlighted above, the drain regions 22 of the respective cells in a vertical column are connected together by a conductive bit line (BL). The channel 28 of the cell 20 conducts current between the source 24 and the drain 22 in accordance with an electric field developed in the channel 28 by the stacked gate structure 26.

According to conventional operation, the memory cell 20 (e.g., flash memory cell) operates in the following manner. The memory cell 20 is programmed by applying a relatively high voltage V$_G$ (e.g., approximately 12 volts) to the control gate 38 and a moderately high voltage V$_D$ (e.g., approximately 9 volts) to the drain 22 in order to produce "hot" (high energy) electrons in the channel 28 near the drain 22. The hot electrons accelerate across the tunnel oxide 32 and into the floating gate 34 and become trapped in the floating gate 38 because the floating gate 38 is surrounded by insulators (the interpoly dielectric 40 and the tunnel oxide 32). As a result of the trapped electrons, a threshold voltage (V$_T$) of the memory cell 20 increases by about 3 to 5 volts. This change in the threshold voltage (and thereby the channel conductance) of the memory cell 20 created by the trapped electrons is what causes the memory cell 20 to be programmed.

To read the memory cell 20, a predetermined voltage V$_G$ that is greater than the threshold voltage of an unprogrammed memory cell, but less than the threshold voltage of a programmed memory cell, is applied to the control gate 44. If the memory cell 20 conducts, then the memory cell 20 has not been programmed (the memory cell 20 is therefore at a first logic state, e.g., a zero "0"). Conversely, if the memory cell 20 does not conduct, then the memory cell 20 has been programmed (the memory cell 20 is therefore at a second logic state, e.g., a one "1"). Thus, each memory cell 20 may be read in order to determine whether it has been programmed (and therefore identify the logic state of the memory cell 20).

In order to erase the memory cell 20, a relatively high voltage V$_S$ (e.g., approximately 12 volts) is applied to the source 24 and the control gate 44 is held at a ground potential (V$_G$=0), while the drain 22 is allowed to float. Under these conditions, a strong electric field is developed across the tunnel oxide 32 between the floating gate 38 and the source region 24. The electrons that are trapped in the floating gate 38 flow toward and cluster at the portion of the floating gate 38 overlying the source region 24 and are extracted from the floating gate 38 and into the source region 22 by way of Fowler-Nordheim tunneling through the tunnel oxide 32. Consequently, as the electrons are removed from the floating gate 38, the memory cell 20 is erased.

Having described a structural arrangement of the memory cell 20, attention is now brought to fabrication of the memory device 10. FIG. 4 illustrates an overall arrangement of the memory device 10 at an early stage of formation. A substrate 30 is shown which comprises regions of thick oxide (field oxide) 34 and thin oxide (tunnel oxide) 32. The field oxide 34 provides for electrically insulating transistors from one and other. A poly I layer 38 has been laid down over the substrate 30, and sections of the poly I layer 38 have been patterned and masked such that an unmasked portion is etched away using convention photolithographic techniques so as to form a series of poly I lines 39. FIG. 5 illustrates an ONO layer 40 laid down over the poly I layer lines 39 and the partially exposed field oxide regions 34 between the poly I layer lines 39. More particularly, since sections of the poly I layer 38 have been etched away, gaps 42 exist between the poly I layer lines 39 38 such that sidewalls of the poly I layer lines 39 become coated with the ONO layer material 40 as it is being deposited. The etching step of the poly I layer 38 causes the ONO layer 40 being deposited thereon to be non-uniform in step height. More specifically, since there are gaps 42 between the poly I layer lines 39, and since the ONO layer 40 conforms to the topography on which it is deposited, the ONO that lies along the sidewalls of the etched poly I lines is significantly thicker that the ONO on top of either the flat portion of the poly I or the flat portion of the field oxide. It is to be appreciated that the thickness of the ONO layer 40 in the figures is shown to be relatively the same as the other layers for ease of understanding, however, the ONO layer 40 is actually very thin relative to the poly I layer 38 and poly II layer 44 (FIG. 6a).

After application of the ONO layer 40, the poly II layer 44 is laid down over the ONO layer 40 as shown in FIG. 6a. Like the ONO layer 40, the poly II layer 44 also includes undulations as a result of the gaps 42 between the poly I layer lines 39. The gaps 42 result in the poly II layer 44 being undulated such that portions of the poly II layer 44 adjacent an edge of a respective poly I layer line 39 (where the ONO layer 40 is thickest) is greater in height with respect to the substrate surface 30 than a portion of the poly II layer 44 which lies relatively over other areas. As will be discussed in greater detail below, the gaps 42 may lead to discontinuity in ONO 40 and poly II 44 thickness.

FIG. 6b illustrates a substantially large maximum step height ($y_M$) that results because of the undulating poly II layer 44. In particular, the step height of a portion of the poly II layer that lies respectively over a poly I layer line 39 has a step height of $y_1$, and a portion of the poly II layer that lies respectively over the gap 42 between adjacent poly I layer lines 39 has a step height of $y_2$. However, the portion of the poly II layer 44 which represents an undulation (i.e., the transition from the poly II layer lying over the poly I layer line 39 and over the gap 42 between poly I layer linse 39) has a step height of $y_M$, where $y_M$ is substantially greater in height than $y_1$ or $y_2$ and results in problems relating to overetch requirements and the formation of an ONO fence as will be discussed in greater detail below.

Referring now to FIG. 7, a resist 50 is lithographically patterned over portions of the poly II layer 44. Then, the poly II layer 44 is etched away at portions not covered by the resist 50, the etched away portion of poly II layer being generally designated at 54.

FIG. 8 is a partial cross-sectional view of the memory device 10 taken at the portion 54. As is seen, the poly II layer 44 has been etched away leaving an ONO layer 40 laid down atop and along vertical sidewalls of the poly I layer lines 39. The field oxide 34 and tunnel oxide 36 of the substrate 30 are not shown for ease of understanding. In FIG. 9, the ONO layer 40 is shown being substantially etched away using conventional etching techniques. The ONO layer 40 has a substantially greater step height at side wall portions 60 of the poly I layer lines 39. As a result, these side wall portions of ONO do not become completely etched away and leave what is coined an ONO fence 64 (FIG. 10) along the sidewalls of the poly I layer line 39.

In FIG. 11, the poly I layer 38 is substantially etched away using conventional etching techniques. However, a problem often occurs at this step involving formation of poly stringers. Poly stringers result from incomplete removal of poly I from the unmasked portions of the wafer during etch. The poly stringers of concern here are created during the self-aligned etch (SAE). During the SAE, the ONO 40 and then the poly I 38 between adjacent second gate lines is etched away. In the SAE, the second gate lines act as a mask. This results in substantially perfect alignment of the first gate with the second gate along a direction perpendicular to the second gate lines—hence, the name self-aligned etch. During the SAE, the ONO along the sidewalls of the poly I is only partially removed, resulting in the ONO fence 64. When the poly I 38 is etched, for some memory cells a small "string" of polysilicon is hidden from the etch by the ONO fence. If this happens to even a few cells in the memory the memory chip will not function properly. As shown in FIG. 12, the ONO fence 64 acts as an umbrella and shields portions of the poly I layer 38 from being etched away. These remaining portions of poly I material are known as poly I stringers 70a and 70b as shown in FIG. 13, which may result in electrically shorting adjacent memory cells 20. In other words, the poly I etching step of FIG. 11 serves in part to isolate one memory cell 20 from another. However, if a portion of the poly I layer 38 is not etched away and forms a conductive path (e.g., poly stringer 70) from one memory cell 20 to another, the memory cells 20 will become electrically shorted.

FIG. 13 illustrates in perspective view the ONO fences 64a, 64b that have lead to the formation of poly stringers 70a, 70b which may cause shorting of poly I layers 38a and 38b of two memory cells 20a and 20b, respectively. The polysilicon floating gates 38a and 38b rest on the oxide coated substrate 30. The ONO fences 64a and 64b remain along the sidewalls of the poly I layers 38a and 38b and in the region 80 between the two memory cells 20a and 20b. The additional layers that make up the stacked gate structure 26 of the respective memory cells 20a and 20b are not shown in prior art FIG. 13 for sake of simplicity.

As long as the initial etching of the poly I layer 38 (which delineates cells 20 along a single word line) occurs in an ideally anisotropic manner, no poly stringers are formed during the second etching of the poly I layer 38 (which delineates separate word lines). It is well known, however, that anisotropic etch processes do not repeatably provide ideally anisotropic profiles. Instead, most anisotropic etch processes provide non-ideal profiles in the range of about 85–95° C. (wherein 90° C. is ideal). A non-ideal anisotropic etch profile as is illustrated in prior art FIG. 12 leaves an angled ONO fence 64 which acts as an umbrella (or shield) to the poly I etch.

More specifically, when the polysilicon layer 38 is subsequently etched (in an anisotropic manner via, e.g., reactive ion etching (RIE)), as illustrated in prior art FIG. 11, the angled ONO fence 64 shields a portion of the polysilicon layer 38, resulting in remnants of polysilicon, which are the poly stringers 70. Transposing the non-ideally anisotropic etched polysilicon gates 38a and 38b and the resulting poly stringers 70 into their macroscopic context (as illustrated in prior art FIG. 13), it is clear that the poly stringers 70 pose a substantial reliability problem since the poly stringers 70 in the etched region 80 can short out the word lines in regions 82 and 84, respectively. That is, instead of the etched region 80 electrically isolating the word lines in regions 82 and 84 from one another, the poly stringers 70 (which are conductive) span the etched region 80 and cause the poly I layers (i.e., floating gates) 38a and 38b in the regions 82 and 84 to be shorted together.

Consequently, in light of the above, it would be desirable to have a method for fabricating a memory cell such that the formation of an ONO fence and resulting poly stringers is eliminated or otherwise substantially reduced.

SUMMARY OF THE INVENTION

The present invention improves memory cell reliability and manufacturability by mitigating formation of poly I stringers caused by an ONO (oxide-nitride-oxide) fence. After a second gate etch to remove a poly II layer, a heavy ion implant step is performed to implant heavy ions in unmasked portions of a poly I layer. As a result of the heavy ion implantation, the unmasked poly I layer is changed in characteristic. More particularly, the heavy ions disrupt the silicon lattice crystalline structure of the unmasked poly I layer (e.g., by breaking the Si—Si bonds). The unmasked poly I layer portion is thus transformed into an amorphous poly I portion which is substantially easier to etch than unamorphized (e.g., crystalline) poly I. Thereafter, a self-aligned etch (SAE) is performed to substantially remove an unmasked ONO portion and the amorphized poly I portion. Since the amorphized poly I is easier to etch than crystallized poly I the probability of etching most or all of the amorphized poly I is significantly greater than etching most or all of crystallized poly I. As a result, the present invention mitigates the formation of poly I stringers.

Furthermore, SAE time is minimized because the amorphized poly I portion is easier to etch than crystalline poly I. As a result, potential damage to the silicon substrate of the memory cell due to the SAE is minimized.

In accordance with one specific aspect of the present invention, a method for fabricating a memory device is provided which includes the step of amorphizing an unmasked portion of a poly I layer prior to etching the unmasked portion of the poly I layer; wherein the amorphized poly I portion has a faster etch rate than crystalline poly I.

According to another aspect of the present invention, a method for fabricating a memory device is provided. In the method, a first polysilicon (poly I) layer is formed over a substrate. Poly I isolation rows are etched into the poly I layer so as to form electrically isolated poly I lines. An oxide-nitride-oxide (ONO) layer is formed over the poly I lines and field oxide portions exposed via the poly I isolation rows. A second polysilicon (poly II) layer is formed over the ONO layer. Poly II isolation rows are etched into the poly II layer so as to form electrically isolated poly II lines, the poly II isolation rows being perpendicular in direction to the poly I isolation rows, the poly II isolation rows exposing portions of the ONO layer. Heavy ions are implanted into portions of the poly I layer via the exposed portions of the ONO layer, wherein the heavy ions disrupt silicon bonds of the poly I layer portions. The exposed portions of the ONO layer and the poly I layer portions are substantially etched away.

In accordance with still another aspect of the present invention a memory device substantially free of poly I stringers is provided. The memory device is fabricated via a method including the step of amorphizing an unmasked portion of a poly I layer prior to etching the unmasked portion of the poly I layer; wherein the amorphized poly I portion has a faster etch rate than crystalline poly I.

To the accomplishment of the foregoing and related ends, the invention then comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 7 is a perspective illustration of the prior art memory device of FIG. 6a after a resist layer has been laid down and portions of the poly II layer have been etched away;

FIG. 8 is a cross-sectional view of the poly I layer, having the ONO layer thereon, of the prior art memory device of FIG. 7;

FIG. 9 is a cross-sectional view of the prior art memory device of FIG. 8, wherein the ONO layer is being etched away;

FIG. 10 is a cross-sectional view of the prior art memory device of FIG. 9, depicting an ONO fence remaining along sidewalls of the poly I layer after the ONO etch step;

DETAILED DESCRIPTION OF THE INVENTION

Figure 1:
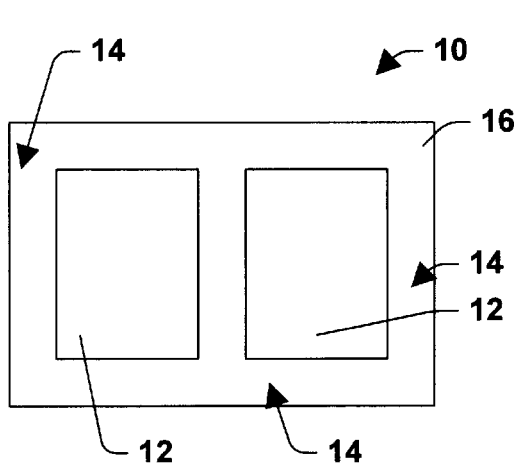
FIG. 1 is a plan view schematically illustrating a prior art layout of a memory device.
Figure 2:
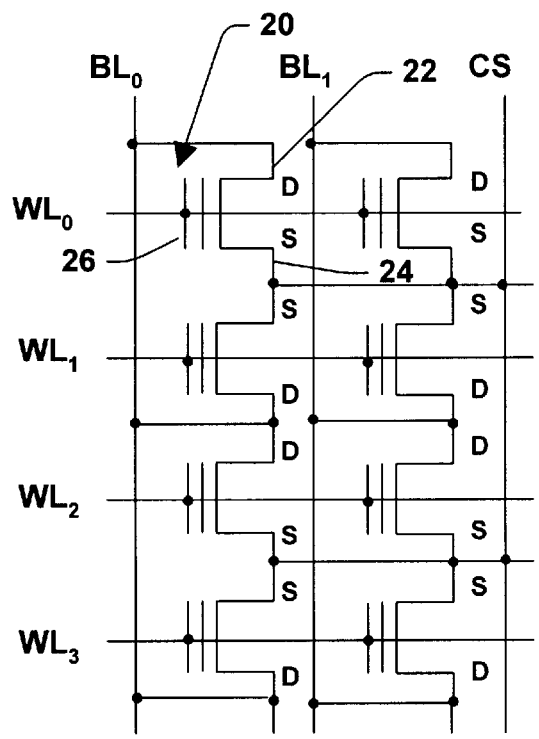
FIG. 2 is a schematic diagram illustrating a prior art core portion of a memory circuit.
Figure 3:
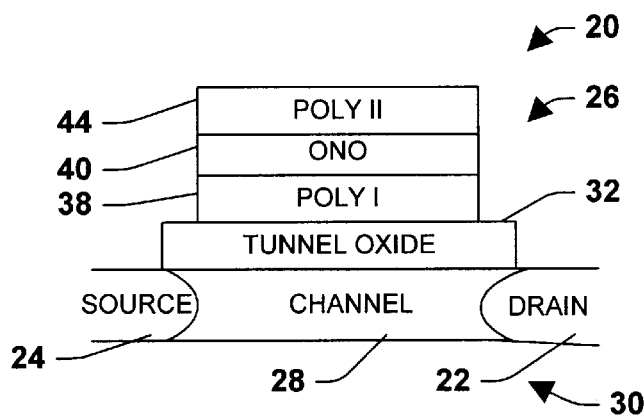
FIG. 3 is a partial cross-sectional view of a prior art stacked gate memory cell.
Figure 4:
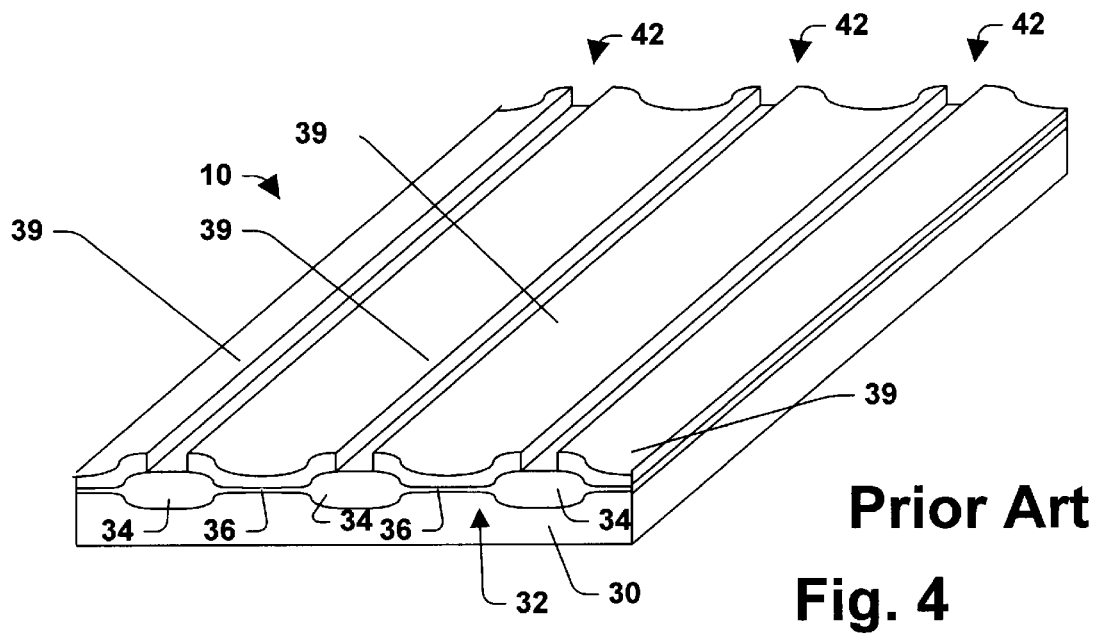
FIG. 4 is a perspective illustration of a portion of a prior art memory device at an early stage in fabrication.
Figure 5:
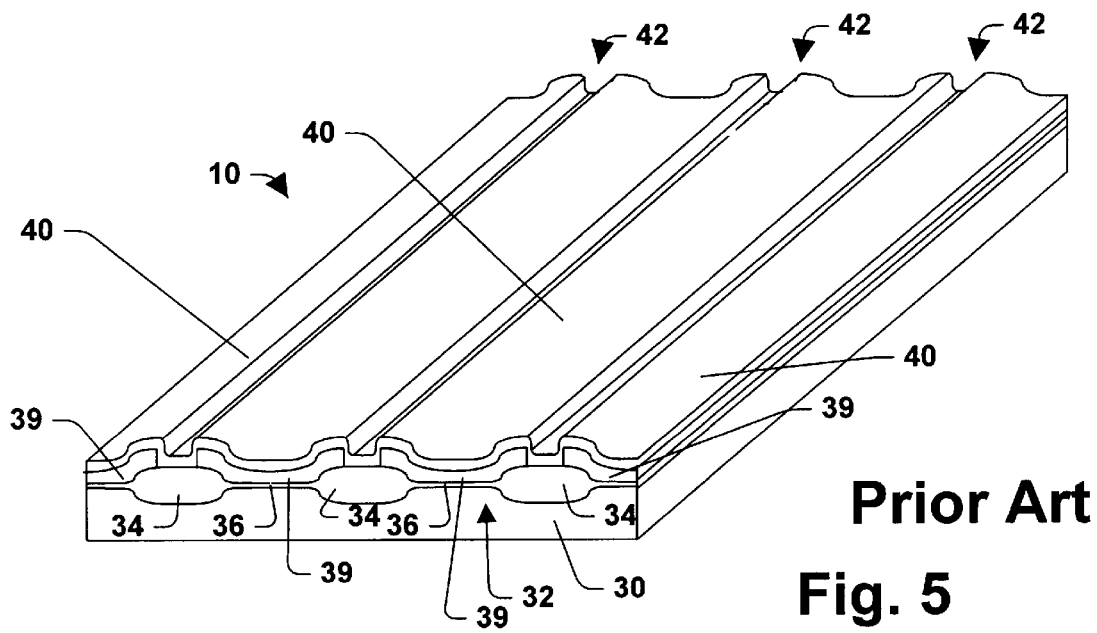
FIG. 5 is a perspective illustration of the prior art memory device of FIG. 4 after formation of an ONO layer.
Figure 6A:
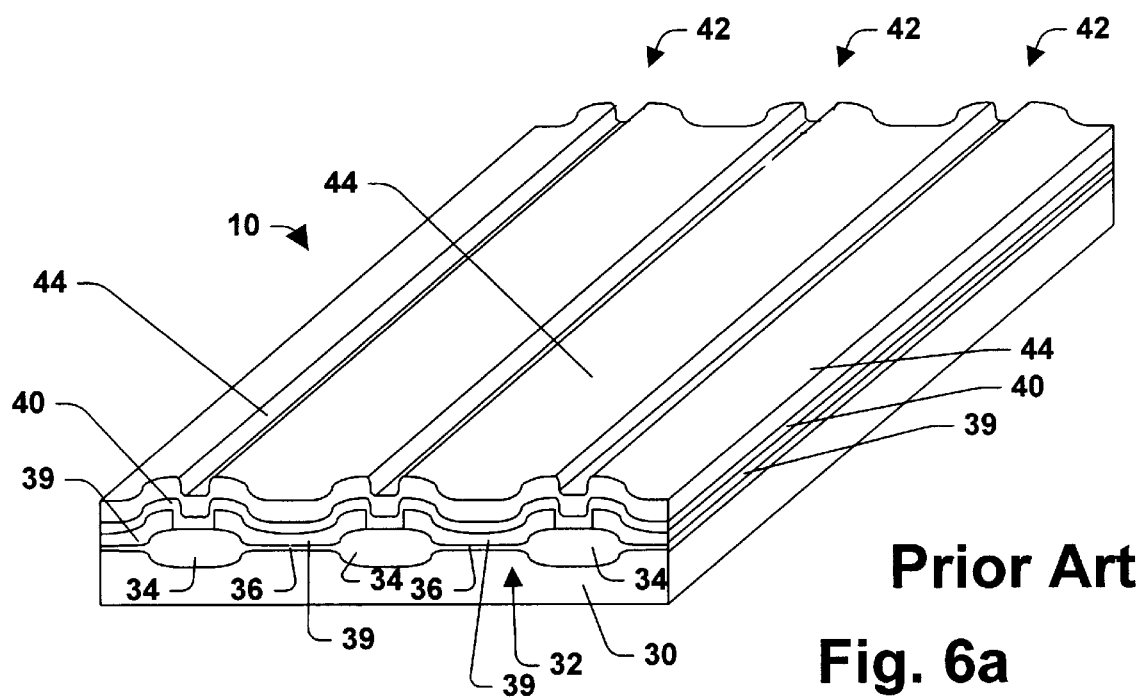
FIG. 6a is a perspective illustration of the prior art memory device of FIG. 5 after formation of a poly II layer.
Figure 6B:
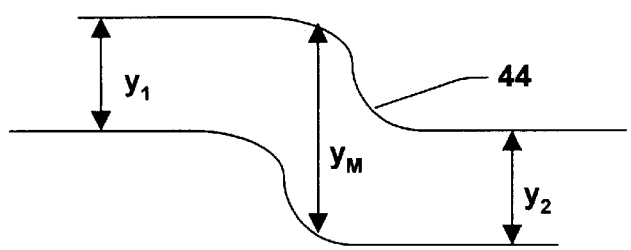
FIG. 6b is a cross-sectional view showing the variation in thickness of the poly II layer in the vicinity of the step in poly I.
Figure 11:
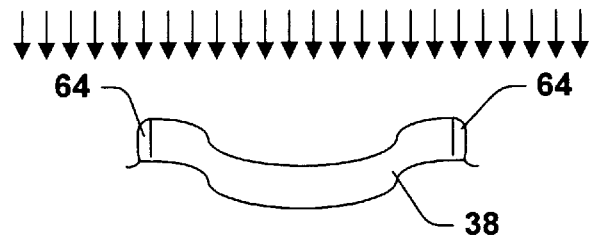
FIG. 11 is a cross-sectional view of the prior art memory device of FIG. 10 wherein the poly I layer is being etched away.
Figure 12:
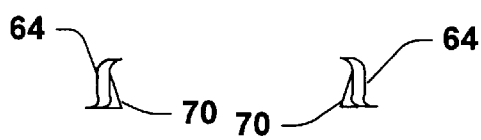
FIG. 12 is a cross-sectional view of the prior art memory device of FIG. 11 wherein the ONO fence shields poly I portions from being etched away during the poly I etch of FIG. 11.
Figure 13:
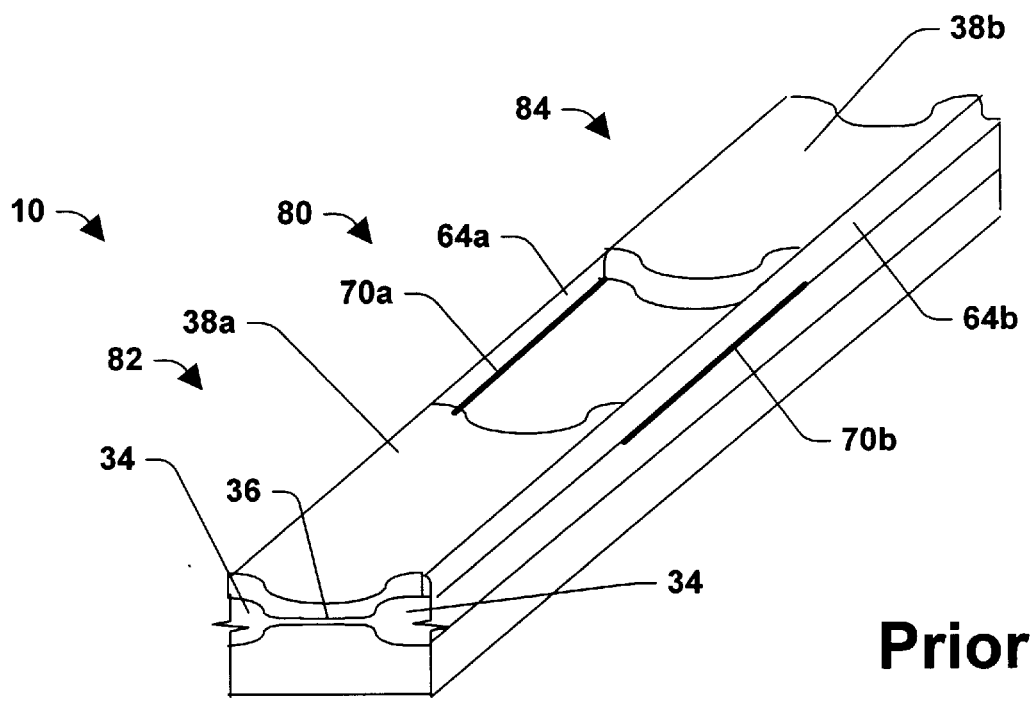
FIG. 13 is a perspective illustration of the prior art memory device of FIG. 12 depicting ONO fences and poly stringers electrically shorting floating gates of adjacent memory cells.

The present invention will now be described with reference to the drawings, wherein like reference numerals are used to refer to like elements throughout.

The present invention amorphizes unmasked portions of a poly I layer via heavy ion implantation. The resulting amorphized poly I portion has a much faster etch rate than crystalline poly I and thus can be substantially removed during SAE. As a result formation of poly I stringers during SAE is mitigated.

Figure 14:
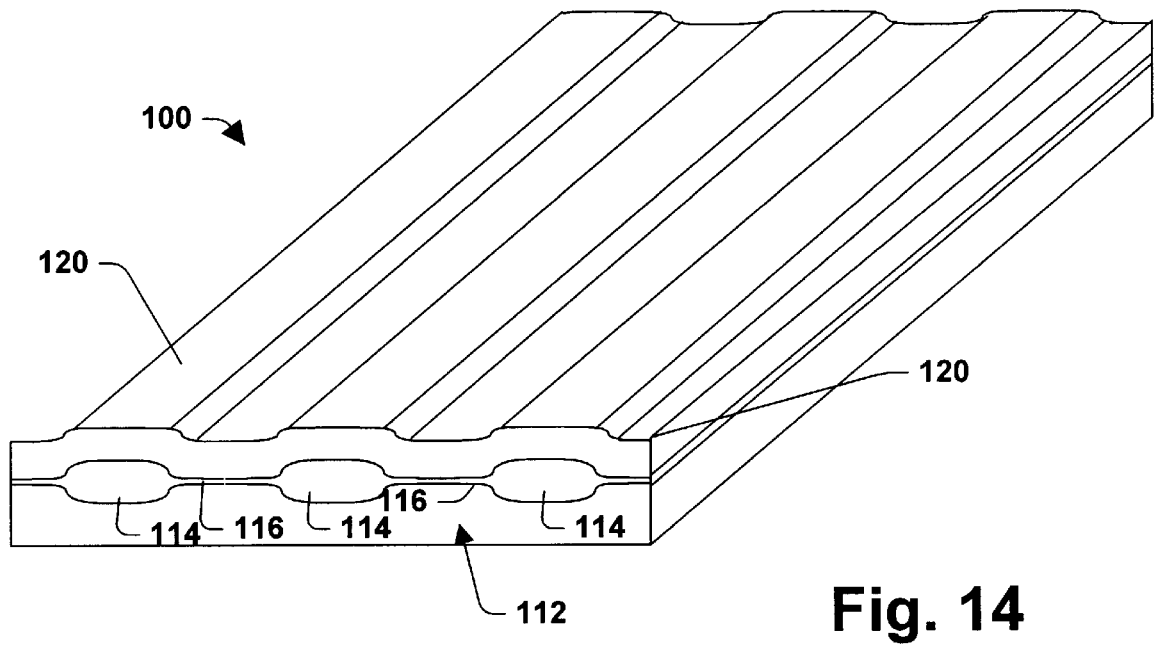
FIG. 14 is a perspective illustration of a portion of a memory device at an early stage in fabrication in accordance with the present invention.

Turning now to FIG. 14, an overall arrangement of a memory device 100 at an early stage of formation is shown in accordance with the present invention. In particular, a silicon substrate 112 is shown comprising field oxide regions 114 and tunnel oxide regions 116. It should be appreciated that although specific layering materials are identified in the preferred embodiment, any materials suitable for carrying out the present invention may be employed and fall within the scope of the claims. A doped polycrystalline silicon (polysilicon or poly I) layer 120 is laid down over the substrate 112. Portions of the poly I layer 120 will serve as floating gates of the memory device 100.

Figure 15:
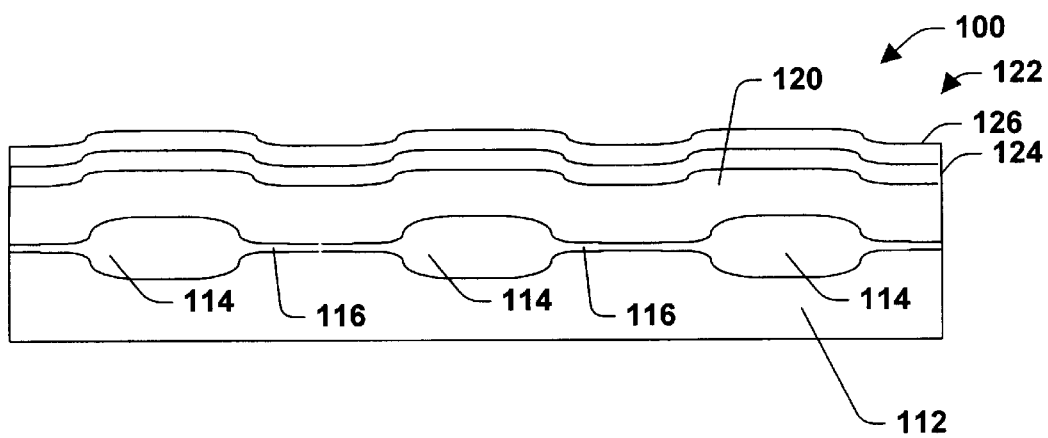
FIG. 15 is a cross-sectional illustration of the memory device of FIG. 14 wherein a masking layer is deposited over a poly I layer in accordance with the present invention.

Turning now to FIG. 15, a hard masking layer 122 is grown/deposited over the poly I layer 120. In the preferred embodiment, the hard masking layer 122 includes a sacrificial oxide layer 124 and a nitride layer 126. More specifically, an oxide is initially grown/deposited over the poly I layer 120 to form the sacrificial oxide layer 124. The sacrificial oxide layer 124 is employed to compensate for the highly tensile characteristics of the subsequently deposited nitride layer 126. In other words, if the silicon nitride layer 126 was directly deposited on the poly I layer 120, the highly tensile characteristics of the silicon nitride layer 126 might result in damage to the poly I layer 120 during instances of thermal mismatch. However, it is to be appreciated that employment of the sacrificial oxide layer 124 may be omitted if desired. Next, as shown in FIG. 15 the topside layer 126 (e.g., silicon nitride) is grown/deposited over the sacrificial oxide layer 124 to complete the hard masking layer 122. Next suitable photolithography steps are carried out so as to define areas of the silicon nitride layer 126 and sacrificial oxide layer 124 which are to be etched away. A photoresist (not shown) is lithographically patterned over portions of the nitride layer 126 to define portions of the poly I layer 120 that are to be etched away to form isolation rows which will isolate adjacent floating gates of the memory device 100.

Figure 16:
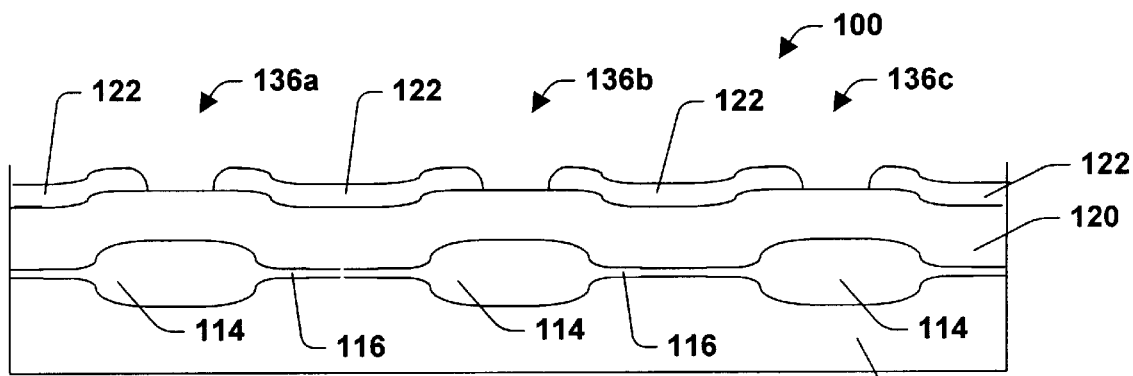
FIG. 16 is a cross-sectional illustration of the memory device of FIG. 15 after portions of the masking layer have been etched away in accordance with the present invention.

FIG. 16 illustrates the hard masking layer 122 being etched away at portions not covered by the photoresist so as to expose portions of the sacrificial oxide layer 130 and underlying poly I layer 120. The silicon nitride layer 126 and the sacrificial oxide layer 124 are shown combined hereon as the hard masking layer 122 for ease of understanding. The hard masking layer 122 may be etched away for example by exposing the hard masking layer 122 to an HF dip to remove any oxide that may have formed over the silicon nitride layer 126. Thereafter, a plasma etch may be employed to etch the silicon nitride layer 126 and underlying sacrificial oxide layer 124.

After the hard masking layer 122 is suitably etched, the photoresist is stripped and suitable pre-oxidation cleaning steps are performed. For example, one method for stripping the photoresist might include employing a dry photoresist strip in an $O_2$ plasma or oxygen plasmastrip and/or a wet clean using sulfuric acid or ammonium hydroxide mixed with ionized water and hydrogen peroxide. It will be appreciated that any suitable method or means for stripping the photoresist and performing pre-oxidation cleaning may be employed and fall within the scope of the present invention.

Figure 17:
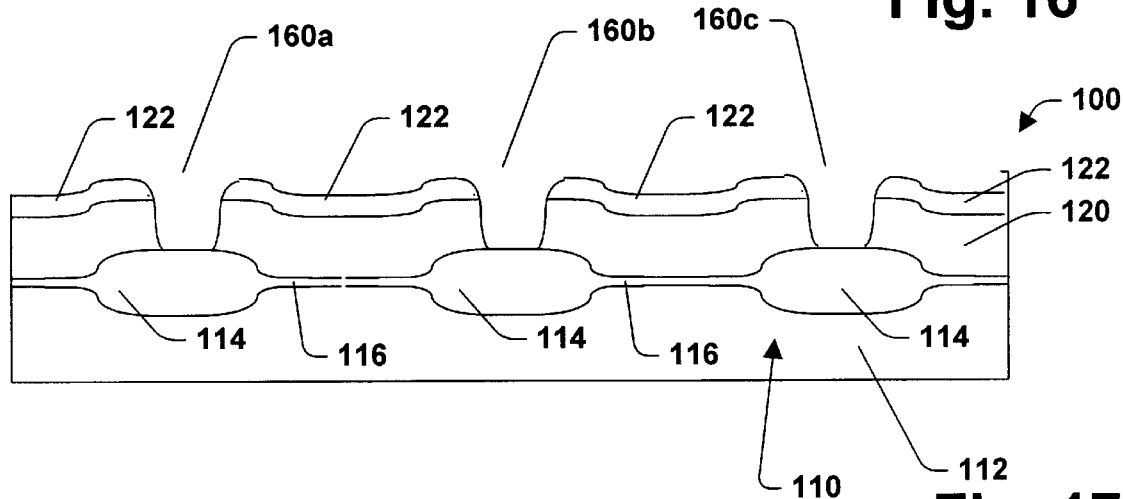
FIG. 17 is a cross-sectional illustration of the memory device of FIG. 16 wherein exposed portions of the poly I layer are etched away to form isolation rows in accordance with the present invention.

The exposed portions 136a, 136b and 136c (collectively referred to by reference numeral 136) of the poly I layer 120 will be etched away to leave isolation rows 160a, 160b and 160c (collectively referred to by 160) which will isolate floating gates of adjacent memory cells as shown in FIG. 17.

Figure 18:
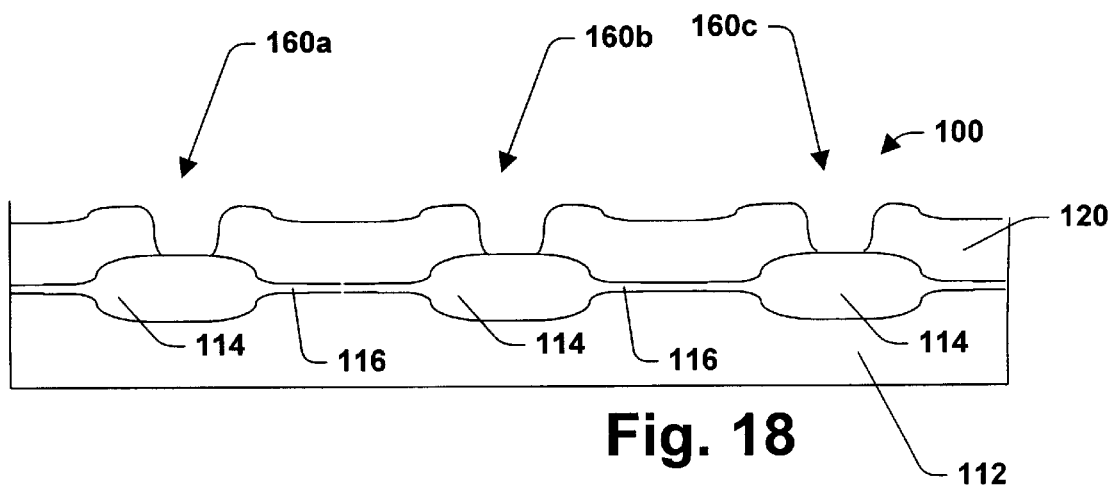
FIG. 18 is a cross-sectional illustration of the memory device of FIG. 17 after the remaining masking layer portions have been stripped away in accordance with the present invention.

Referring now to FIG. 18, after the isolation rows 160 are formed the remaining portions of the hard masking layer 122 are stripped leaving exposed poly I layer 120 portions separated by the poly I isolation rows 160.

Figure 19:
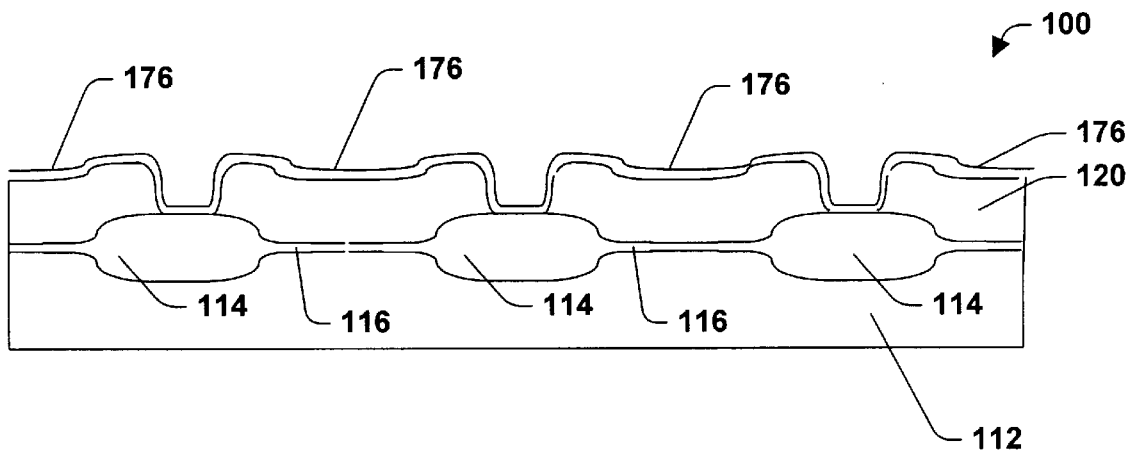
FIG. 19 is a cross-sectional illustration of the memory device of FIG. 18 after an ONO layer is deposited over the remaining poly I layer and field oxide regions in accordance with the present invention.
Figure 20:
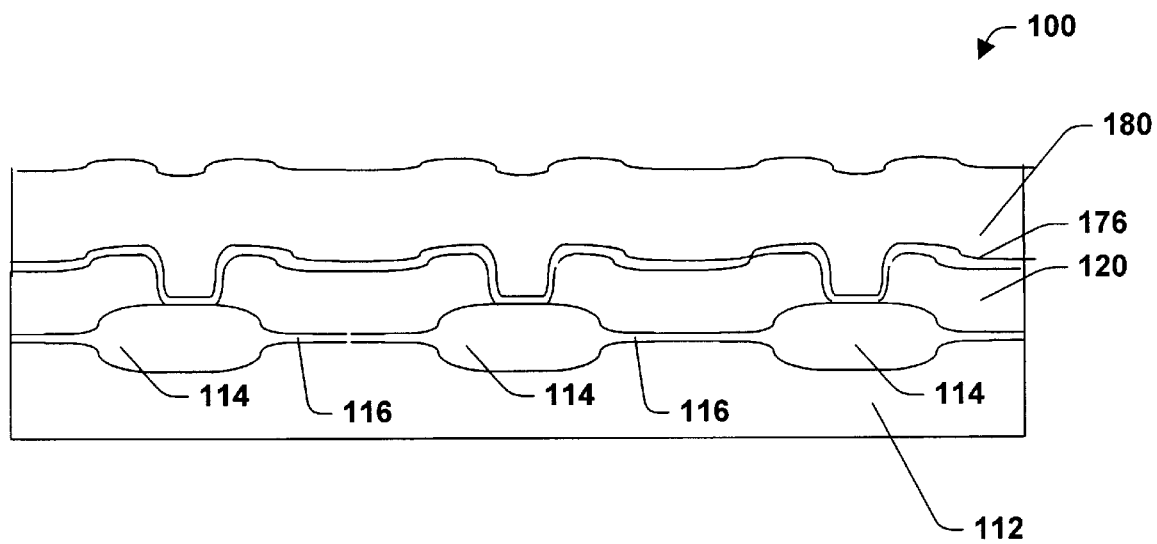
FIG. 20 is a cross-sectional illustration of the memory device of FIG. 19 after a poly II layer has been deposited over the ONO layer in accordance with the present invention.
Figure 21:
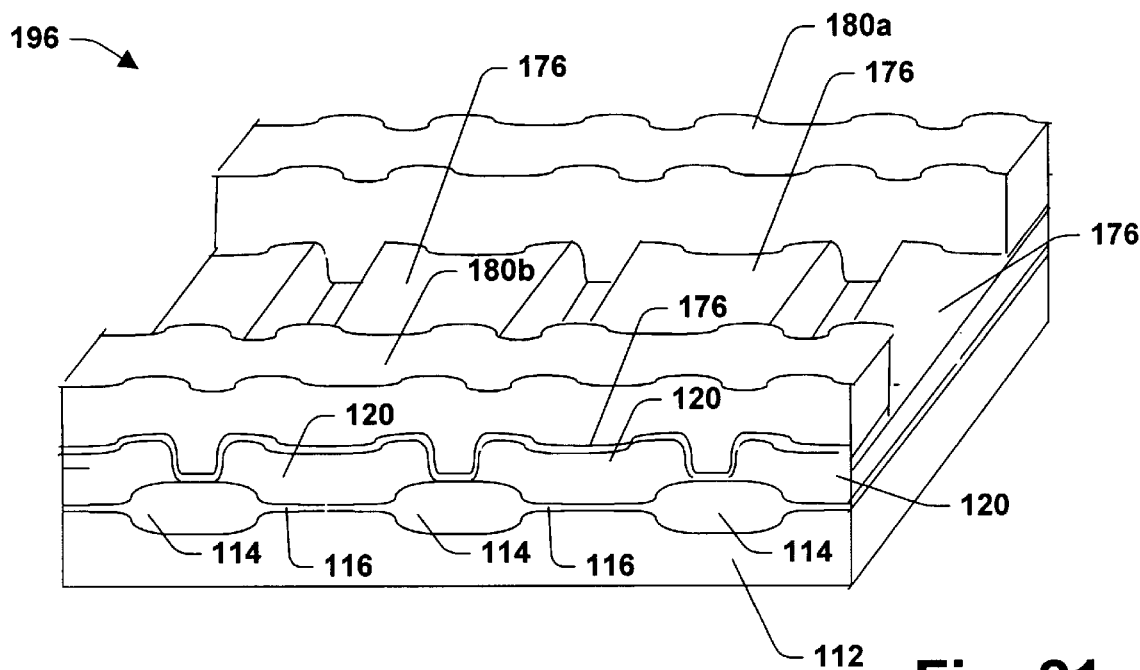
FIG. 21 is a perspective drawing illustrating the memory device of FIG. 20 after an unmasked portion of the poly II layer has been etched away to the ONO layer in accordance with the present invention.

FIG. 19 shows an ONO layer 176 laid down over the remaining poly I portions 120 and portions of the field oxide regions 114. Turning now to FIG. 20, a poly II layer 180 is shown being laid down over the ONO layer 176. Thereafter, the poly II layer 180 is masked such that unmasked portions 196 of the poly II layer 180 are etched away using suitable techniques as shown in FIG. 21. As can be seen, the unmasked portion 196 of the poly II layer is etched away exposing a portion of the underlying ONO layer 176. The poly II layer 180 has been separated into poly II lines 180a and 180b electrically isolated from each other by the etched away poly II portion 196. Portions of the poly II lines 180a and 180b will serve as control gates of memory cells of the memory device 100.

Figure 22:
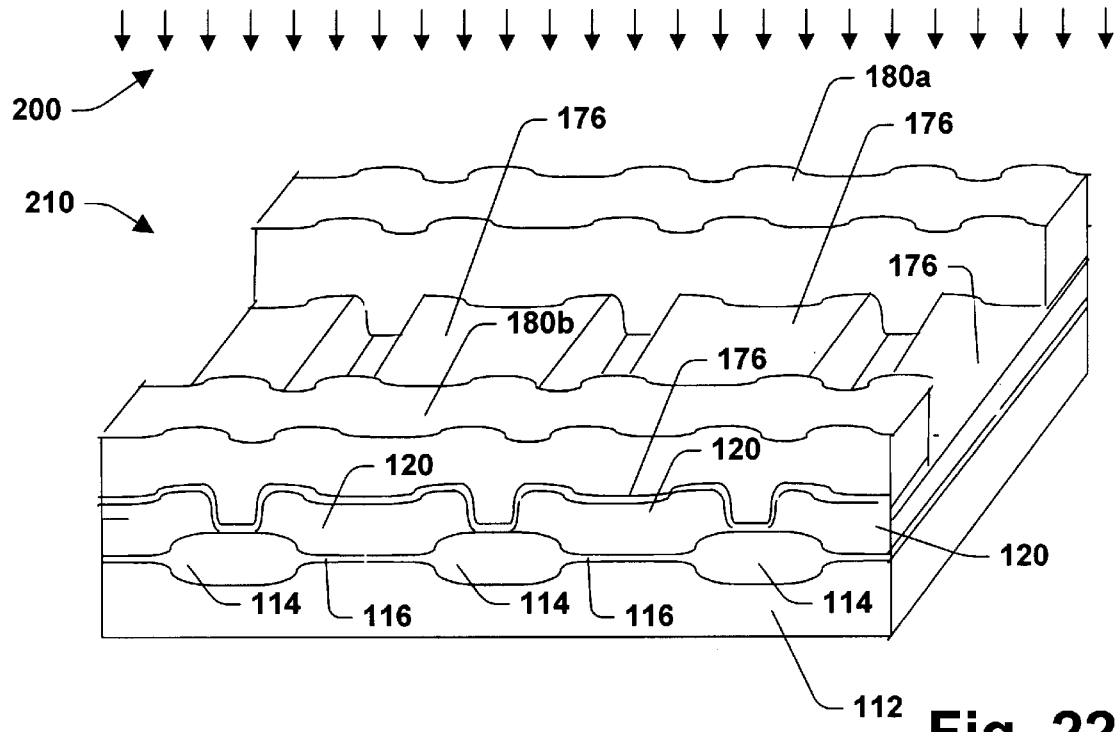
FIG. 22 is a perspective drawing illustrating the memory device of FIG. 21 wherein an unmasked portion of the ONO layer and poly I layer portion are exposed to a heavy ion implant in accordance with the present invention.

FIG. 22 illustrates a heavy ion implantation step, where heavy ions 200 are implanted into a portion of the poly I layer which underlies the unmasked portion 210 of the ONO layer 176. In the preferred embodiment, the heavy ions may include silicon (Si), germanium (Ge), oxygen ($O_2$) or any combination thereof. However, it is to be appreciated that any ions suitable for carrying out the present invention may be employed and fall within the scope of the present invention as defined by the hereto appended claims. It is desirable to select ions which are non-dopants so that implantation thereof into the memory device structure 100 will not result in contamination.

The heavy ions 200 are preferably implanted at a dose within the range of $1 \times 10^{14}$ cm$^2$ to $5 \times 10^{15}$ cm$^2$ and at an energy level within the range of 10 keV to 30 keV. Of course, it is understood that the above dosage and energy ranges are representative of exemplary ranges and that any suitable dosage and energy level may be employed to carry out the present invention. Thus, the heavy ion dosage and energy level may be suitably tailored in accordance with the type of ion employed and the characteristics of the poly I layer 120. Moreover, the choice of the type of heavy ion to employ will be a function of the effectiveness of the ion to amorphize the unmasked poly I layer 120 and the etch chemistry compatibility with the unmasked poly I layer 120.

As noted above, the present invention improves memory cell reliability and manufacturability by mitigating formation of poly I stringers caused by an ONO (oxide-nitride-oxide) fence. After the second gate etch to remove a selected portion of the poly II layer 180, the heavy ion implant step is performed to implant the heavy ions 200 in unmasked portions of the poly I layer 120. As a result of the heavy ion implantation, the unmasked poly I layer is changed in characteristic. More particularly, the heavy ions disrupt the silicon lattice crystalline structure of the unmasked poly I layer (e.g., by breaking the Si—Si bonds). The unmasked poly I layer portion is thus transformed into amorphous poly I which is substantially easier to etch than crystalline poly I.

Conventionally, a reactive ion etch (RIE) step is performed to removed an unmasked portion of a poly I layer to form floating gates of a memory device. The RIE mechanism consists of two components: (1) chemical reactions for etch selectivity control; and (2) physical bombardments for straight profile control. However, these two components are contradictory to each other and make the etch process difficult to optimize and control as is well known in the art.

Using a heavy ion implant step to amorphize an unmasked portion of the poly I layer followed by a more chemical oriented etch (as described in connection with FIGS. 23 and 24) in accordance with the present invention affords for easier (and independent) process optimizations as compared to conventional techniques. Optimal etch selectivity and etch profile control can be achieved with the approach provided by the present invention. Moreover, the present invention provides for reducing or eliminating the high voltage bias required in conventional RIE etch processes and the related side effects (e.g., device degradations, etch loading and proximity effects).

Figure 23:
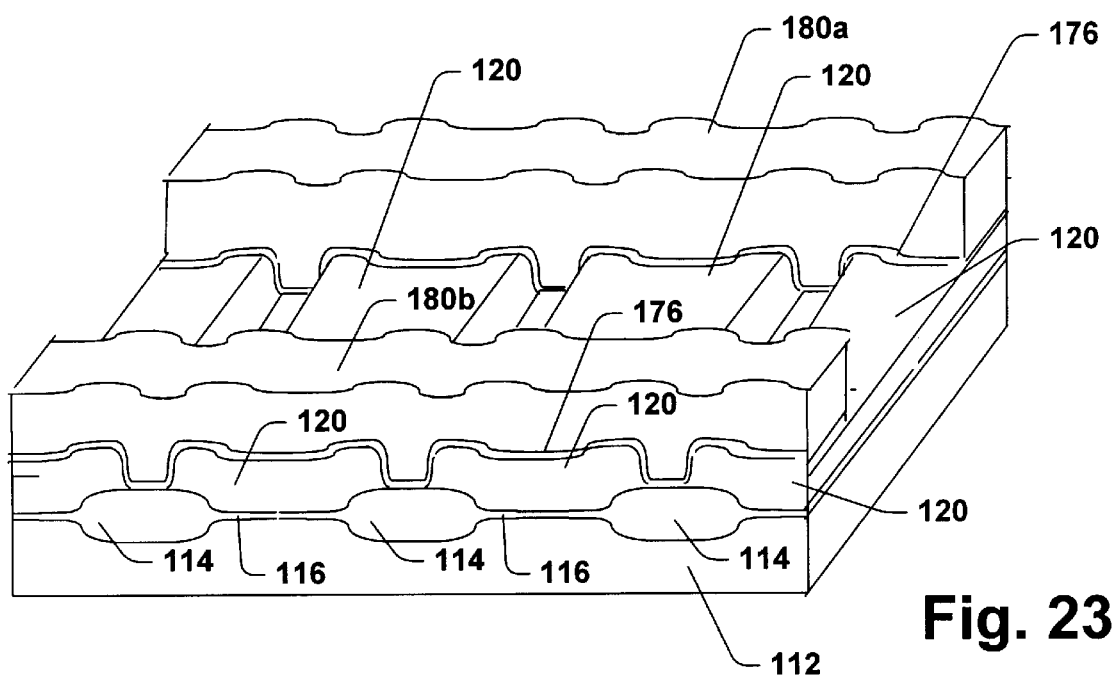
FIG. 23 is a perspective drawing illustrating the memory device of FIG. 22 after the unmasked portion of the ONO layer has been etched away during self-aligned etch (SAE) in accordance with the present invention.
Figure 24:
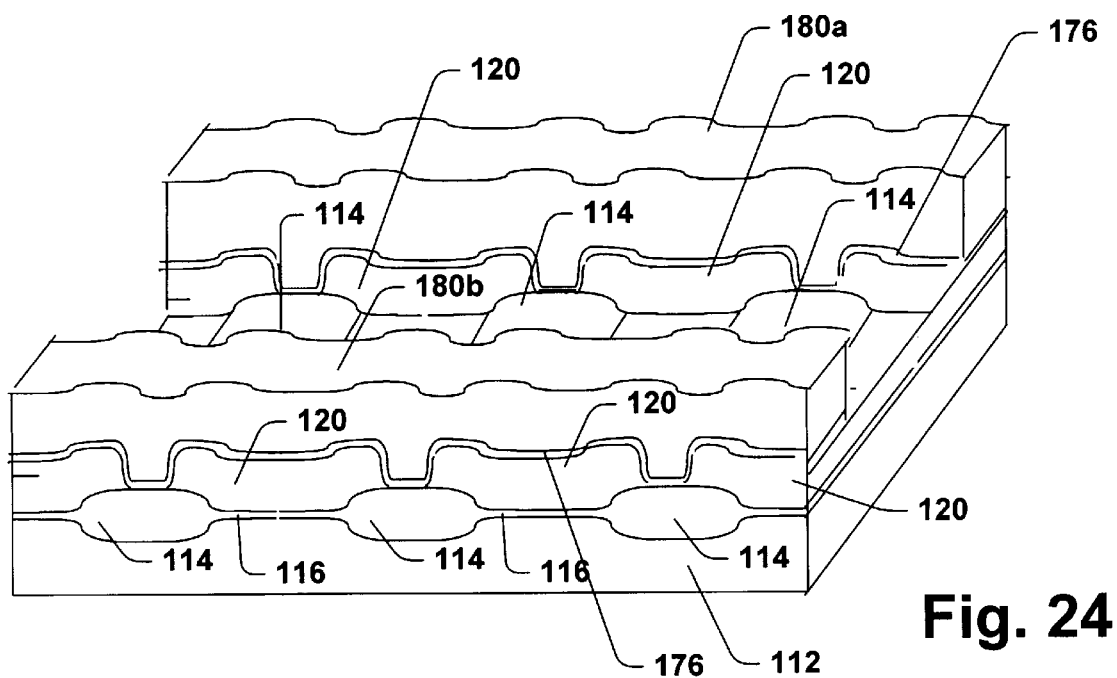
FIG. 24 is a perspective drawing illustrating electrically isolated memory cells after a substantially final etching step to remove an amorphized poly I layer portion in accordance with the present invention.

FIG. 23 illustrates the memory device 100 after the unmasked portion of the ONO layer has been etched away during SAE. FIG. 24 illustrates the memory device after the amorphized poly I layer has been etched away during SAE. It is to be appreciated that an anneal step is not performed prior to etching of the amorphized poly I portion because an anneal step would result in the amorphized poly I being recrystallized and thus substantially more difficult to etch. The amorphized poly I has an improved (or lower) activation energy for etch due to the broken Si—Si bonds. Therefore, the amorphized poly I is substantially easier to etch than crystalline poly I. Thus, during the self-aligned etch (SAE) to remove the unmasked ONO portion and the amorphized poly I the amorphized poly I portion is substantially removed thus mitigating the formation of poly I stringers.

Furthermore, SAE time is minimized because the amorphized poly I portion is easier to etch than crystalline poly I. As a result, potential damage to the silicon substrate of the memory cell due to the SAE is minimized as compared to memory cells fabricated under conventional techniques.

The present invention thus provides for mitigating formation of poly I stringers by amorphizing selected portions of the poly I layer so that the amorphized poly I portions may be substantially etched away during an SAE step to isolate individual memory cells. As a result, the present invention affords for improving density of memory devices, improving reliability of memory devices, improving accuracy and efficiency of memory devices, and provides for simplifying manufacturing processes associated with memory devices and costs related thereto.

Those skilled in the art will recognize that the embodiment(s) described above and illustrated in the attached drawings are intended for purposes of illustration only and that the subject invention may be implemented in various ways. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method for fabricating a memory device, comprising the step of:

amorphizing an unmasked portion of a poly I layer prior to etching the unmasked portion of the poly I layer via implanting at least one of silicon ions and germanium ions into the unmasked poly I portion;

wherein the amorphized poly I portion has a faster etch rate than crystalline poly I.

2. The method of claim 1, further including the step of implanting the ions at a dosage within the range of $1 \times 10^{14}$ cm$^2$ to $5 \times 10^{15}$ cm$^2$.

3. The method of claim 1, further including the step of implanting the heavy ions at an energy level within the range of 10 keV to 30 keV.

4. The method of claim 1, the amorphization step being performed prior to an anneal step.

5. The method of claim 1 further including the step of substantially etching the amorphized silicon via a self-aligned etch so that formation of poly I stringers is mitigated.

6. A method for fabricating a memory device, comprising the steps of:

forming a first polysilicon (poly I) layer over a substrate;

etching poly I isolation rows into the poly I layer so as to form electrically isolated poly I lines;

forming an oxide-nitride-oxide (ONO) layer over the poly I lines and field oxide portions exposed via the poly I isolation rows;

forming a second polysilicon (poly II) layer over the ONO layer;

etching poly II isolation rows into the poly II layer so as to form electrically isolated poly II lines, the poly II isolation rows being perpendicular in direction to the poly I isolation rows, the poly II isolation rows exposing portions of the ONO layer; and implanting heavy ions into portions of the poly I layer via the exposed portions of the ONO layer, the heavy ions comprising at least one of: silicon ions, and germanium ions, wherein the heavy ions disrupt silicon bonds of the poly I layer portions; and substantially etching away the exposed portions of the ONO layer and the poly I layer portions.

7. The method of claim 6, the heavy ion implant step including the step of implanting oxygen ions into the poly I portions.

8. The method of claim 6, further including the step of implanting the heavy ions at a dosage within the range of $1 \times 10^{14}$ cm$^2$ to $5 \times 10^{15}$ cm$^2$.

9. The method of claim 6, further including the step of implanting the heavy ions at an energy level within the range of 10 keV to 30 keV.

10. The method of claim 6, the heavy ion implant step being performed prior to an anneal step.

* * * * *